(12) United States Patent
Shi et al.

(10) Patent No.: US 10,826,475 B2
(45) Date of Patent: Nov. 3, 2020

(54) SHIFT REGISTER AND DRIVING METHOD THEREOF, CASCADE DRIVING CIRCUIT AND DISPLAY DEVICE

(71) Applicant: BOE TECHNOLOGY GROUP CO., LTD., Beijing (CN)

(72) Inventors: Lubin Shi, Beijing (CN); Xiaohai Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/698,111

(22) Filed: Nov. 27, 2019

(65) Prior Publication Data

US 2020/0266809 A1 Aug. 20, 2020

(30) Foreign Application Priority Data

Feb. 19, 2019 (CN) .......................... 2019 1 0121591

(51) Int. Cl.
*H03K 5/135* (2006.01)
*G09G 3/36* (2006.01)
(52) U.S. Cl.
CPC ........... *H03K 5/135* (2013.01); *G09G 3/3674* (2013.01)
(58) Field of Classification Search
CPC ......... H03K 5/13; H03K 5/135; G09G 3/3674
See application file for complete search history.

(56) References Cited

U.S. PATENT DOCUMENTS

| 8,059,780 | B2 | 11/2011 | Wang et al. |
| 9,396,691 | B2 | 7/2016 | Zeng |
| 10,224,112 | B2 * | 3/2019 | Hao ........................ G11C 19/28 |
| 2010/0134234 | A1 | 6/2010 | Liao et al. |

(Continued)

FOREIGN PATENT DOCUMENTS

| CN | 103985369 A | 8/2014 |
| CN | 104240631 A | 12/2014 |

(Continued)

OTHER PUBLICATIONS

First Office Action dated Apr. 29, 2020 corresponding to Chinese application No. 201910121591.0.

*Primary Examiner* — Diana J. Cheng
(74) *Attorney, Agent, or Firm* — Nath, Goldberg & Meyer; Joshua B. Goldberg (57) ABSTRACT

A shift register includes: a first control and output circuit coupled to precharge signal input terminal, first and second power supply terminals, first to third clock signal terminals, first signal output terminal, and configured to write second clock signal provided through the second clock signal terminal to the first signal output terminal during precharge and output phases, and write second operating voltage provided through the second power supply terminal to the first signal output terminal during reset phase; and a second control and output circuit coupled to the first and second power supply terminals, the third clock signal terminal, the precharge signal input terminal, second signal output terminal, and configured to write first operating voltage provided through the first power supply terminal to the second signal output terminal during the precharge and output phases, and write the second operating voltage to the second signal output terminal in the reset phase.

20 Claims, 5 Drawing Sheets

(56) References Cited

U.S. PATENT DOCUMENTS

2013/0335392 A1   12/2013  Cho et al.
2016/0064098 A1*  3/2016  Han .................... G09G 3/3225
                                                            345/211
2017/0160607 A1    6/2017  Zhao et al.

FOREIGN PATENT DOCUMENTS

| CN | 104282287 A | 1/2015 |
| --- | --- | --- |
| CN | 105223746 A | 1/2016 |
| CN | 106023874 A | 10/2016 |
| CN | 106548740 A | 3/2017 |
| CN | 206312552 U | 7/2017 |
| CN | 108182917 A | 6/2018 |
| CN | 207489447 U | 6/2018 |
| WO | 2017049659 A1 | 3/2017 |

* cited by examiner

SHIFT REGISTER AND DRIVING METHOD THEREOF, CASCADE DRIVING CIRCUIT AND DISPLAY DEVICE

CROSS-REFERENCE TO RELATED APPLICATION

This application claims priority to Chinese Patent Application No. 201910121591.0, filed on Feb. 19, 2019 to China National Intellectual Property Administration, the contents of which are incorporated herein by reference in the entirety.

TECHNICAL FIELD

The present disclosure relates to the field of display technology, and in particular, to a shift register, a driving method thereof, a cascade driving circuit, and a display device.

BACKGROUND

An organic light emitting diode (OLED) display device is one of the hot spots in the research field of flat panel display, and light emission and display of the OLED display device is generally performed by driving the OLED through a pixel circuit in a pixel.

In order to realize the light emission function of the OLED display device, at least a gate driving signal (also referred to as a scanning signal) and a light emitting driving signal are generally required to be input to the pixel circuit. At present, generally, a gate driving circuit is disposed in a non-display area of the OLED display panel to provide a desired gate driving signal, and a light emitting driving circuit is disposed to provide a desired light emitting driving signal.

However, since the gate driving circuit for providing the gate driving signal and the light emitting driving circuit for providing the light emitting driving signal are separately disposed, the circuit design is complicated, the occupied space is large, and it is not favorable for implementing the narrow bezel design of the OLED display device.

SUMMARY

In a first aspect, an embodiment of the present disclosure provides a shift register, including: a first control and output circuit, coupled to a precharge signal input terminal, a first power supply terminal, a second power supply terminal, a first clock signal terminal, a second clock signal terminal, a third clock signal terminal and a first signal output terminal, and configured to write, in a precharge phase and an output phase, a second clock signal provided through the second clock signal terminal to the first signal output terminal in response to a first clock signal provided through the first clock signal terminal and a precharge signal provided through a precharge signal input terminal, and write, in a reset phase, a second operating voltage provided through the second power supply terminal to the first signal output terminal in response to a third clock signal provided through the third clock signal terminal; and a second control and output circuit, coupled to the first power supply terminal, the second power supply terminal, the third clock signal terminal, the precharge signal input terminal, and a second signal output terminal, and configured to write, in the precharge phase and the output phase, a first operating voltage provided through the first power supply terminal to the second signal output terminal in response to the first clock signal and the precharge signal, and write, in the reset phase, the second operating voltage to the second signal output terminal in response to the third clock signal.

In some embodiments, the first control and output circuit includes: a precharge circuit, coupled to the precharge signal input terminal, the first clock signal terminal and the first pull-up node, and configured to write, in the precharge phase, the precharge signal provided through the precharge signal input terminal to the first pull-up node in response to the first clock signal; a first node control circuit, coupled to the first power supply terminal, the second power supply terminal, the third clock signal terminal, the first pull-up node, and the first pull-down node, and configured to write, in the precharge phase, the second operating voltage to the first pull-down node in response to a voltage at the first pull-up node, and write, in the reset phase, the first operating voltage to the first pull-down node and the second operating voltage to the first pull-up node, in response to the third clock signal; and a first output circuit, coupled to the first signal output terminal, the second power supply terminal, the second clock signal terminal, the first pull-up node and the first pull-down node, and configured to write, in the precharge phase and the output phase, the second clock signal to the first signal output terminal in response to the voltage at the first pull-up node, and write, in the reset phase, the second operating voltage to the first signal output terminal in response to a voltage at the first pull-down node.

In some embodiments, the second control and output circuit includes: a second node control circuit, coupled to the precharge signal input terminal, the first power supply terminal, the second power supply terminal, the first clock signal terminal, the third clock signal terminal, a second pull-up node, and a second pull-down node, and configured to write, in the precharge phase, the precharge signal to the second pull-down node and the second operating voltage to the second pull-up node, in response to the first clock signal, and write, in the reset phase, the first operating voltage to the second pull-up node and the first operating voltage to the second pull-down node, in response to the third clock signal; and a second output circuit, coupled to the first power supply terminal, the second power supply terminal, the first pull-up node and the first pull-down node, and configured to write, in the precharge phase and the output phase, the first operating voltage to the second signal output terminal in response to a voltage at the second pull-up node, and write, in the reset phase, the second operating voltage to the second signal output terminal in response to a voltage at the second pull-down node.

In some embodiments, the first node control circuit includes: a first pull-down control sub-circuit, coupled to the first power supply terminal, the second power supply terminal, the third clock signal terminal, the first pull-up node, and the first pull-down node, and configured to write, in the precharge phase, the second operating voltage to the first pull-down node in response to the voltage at the first pull-up node, and write, in the reset phase, the first operating voltage to the first pull-down node in response to the third clock signal; and a first pull-up control sub-circuit, coupled to the second power supply terminal, the first pull-up node and the first pull-down node, and configured to write, in the reset phase, the second operating voltage to the first pull-up node in response to the voltage at the first pull-down node.

In some embodiments, the first node control circuit further includes an auxiliary charging sub-circuit, coupled to the second power supply terminal, the precharge signal input terminal and the first pull-down node and configured to write, in the precharge phase, the second operating voltage to the first pull-down node in response to the precharge signal.

In some embodiments, the auxiliary charging sub-circuit includes a first transistor. A control electrode of the first transistor is coupled to the precharge signal input terminal, a first electrode of the first transistor is coupled to the second power supply terminal, and a second electrode of the first transistor is coupled to the first pull-down node.

In some embodiments, the first pull-down control sub-circuit includes a second transistor and a third transistor. A control electrode of the second transistor is coupled to the first pull-up node, a first electrode of the second transistor is coupled to the second power supply terminal, and a second electrode of the second transistor is coupled to the first pull-down node. A control electrode of the third transistor is coupled to the third clock signal terminal, a first electrode of the third transistor is coupled to the first power supply terminal, and a second electrode of the third transistor is coupled to the first pull-down node.

In some embodiments, the first pull-down control sub-circuit further includes a first capacitor. A first terminal of the first capacitor is coupled to the second power supply terminal, and a second terminal of the first capacitor is coupled to the first pull-down node.

In some embodiments, the first pull-up control sub-circuit includes a fourth transistor. A control electrode of the fourth transistor is coupled to the first pull-down node, a first electrode of the fourth transistor is coupled to the second power supply terminal, and a second electrode of the fourth transistor is coupled to the first pull-up node.

In some embodiments, the second node control circuit includes: a second pull-down control sub-circuit, coupled to the precharge signal input terminal, the second power supply terminal, the first clock signal terminal, the second pull-up node, and the second pull-down node, and configured to write, in the precharge phase, the precharge signal to the second pull-down node in response to the first clock signal, and write, in the reset phase, the second operating voltage to the second pull-down node in response to the voltage at the second pull-up node; and a second pull-up control sub-circuit, coupled to the first power supply terminal, the second power supply terminal, the third clock signal terminal, the second pull-up node, and the second pull-down node, and configured to write, in the precharge phase and the output phase, the second operating voltage to the second pull-up node in response to the voltage at the second pull-down node, and write, in the reset phase, the first operating voltage to the second pull-up node in response to the third clock signal.

In some embodiments, the second pull-down control sub-circuit includes a fifth transistor and a sixth transistor. A control electrode of the fifth transistor is coupled to the first clock signal terminal, a first electrode of the fifth transistor is coupled to the precharge signal input terminal, and a second electrode of the fifth transistor is coupled to the second pull-down node. A control electrode of the sixth transistor is coupled to the second pull-up node, a first electrode of the sixth transistor is coupled to the second power supply terminal, and a second electrode of the sixth transistor is coupled to the second pull-down node.

In some embodiments, the second pull-down control sub-circuit further includes a second capacitor. A first terminal of the second capacitor is coupled to the second power supply terminal, and a second terminal of the second capacitor is coupled to the second pull-down node.

In some embodiments, the second pull-up control sub-circuit includes a seventh transistor and an eighth transistor. A control electrode of the seventh transistor is coupled to the second pull-down node, a first electrode of the seventh transistor is coupled to the second power supply terminal, and a second electrode of the seventh transistor is coupled to the second pull-up node. A control electrode of the eighth transistor is coupled to the third clock signal terminal, a first electrode of the eighth transistor is coupled to the first power supply terminal, and a second electrode of the eighth transistor is coupled to the second pull-up node.

In some embodiments, the precharge circuit includes a ninth transistor. A control electrode of the ninth transistor is coupled to the first clock signal terminal, a first electrode of the ninth transistor is coupled to the precharge signal input terminal, and a second electrode of the ninth transistor is coupled to the first pull-up node.

In some embodiments, the first output circuit includes a tenth transistor, an eleventh transistor, and a third capacitor. A control electrode of the tenth transistor is coupled to the first pull-up node, a first electrode of the tenth transistor is coupled to the second clock signal terminal, and a second electrode of the tenth transistor is coupled to the first signal output terminal. A control electrode of the eleventh transistor is coupled to the first pull-down node, a first electrode of the eleventh transistor is coupled to the second power supply terminal, and a second electrode of the eleventh transistor is coupled to the first signal output terminal. A first terminal of the third capacitor is coupled to the first pull-up node, and a second terminal of the third capacitor is coupled to the first signal output terminal.

In some embodiments, the second output circuit includes a twelfth transistor, a thirteenth transistor, and a fourth capacitor. A control electrode of the twelfth transistor is coupled to the second pull-up node, a first electrode of the twelfth transistor is coupled to the first power supply terminal, and a second electrode of the twelfth transistor is coupled to the second signal output terminal. A control electrode of the thirteenth transistor is coupled to the second pull-down node, a first electrode of the thirteenth transistor is coupled to the second power supply terminal, and a second electrode of the thirteenth transistor is coupled to the second signal output terminal. A first terminal of the fourth capacitor is coupled to the second pull-up node, and a second terminal of the fourth capacitor is coupled to the second signal output terminal.

In some embodiments, all transistors in the shift register are N-type low temperature poly-silicon thin film transistors.

In a second aspect, an embodiment of the present disclosure further provides a cascade driving circuit, including a plurality of shift registers that are cascaded. The shift registers adopt the above-described shift registers. The precharge signal input terminal of the shift register in a first stage is coupled to a frame starting signal input terminal; for each of the shift registers other than the shift register in the first stage, the precharge signal input terminal of the shift register is coupled to the first signal output terminal of the shift register in a previous stage. The first clock signal terminal of the shift register in a (3n+1)th stage is coupled to a first clock signal line, the second clock signal terminal of the shift register in the (3n+1)th stage is coupled to a second clock signal line, and the third clock signal terminal of the shift register in the (3n+1)th stage is coupled to a third clock signal line; the first clock signal terminal of the shift register in a (3n+2)th stage is coupled to the second clock signal line, the second clock signal terminal of the shift register in the (3n+2)th stage is coupled to the third clock signal line, and the third clock signal terminal of the shift register in the (3n+2)th stage is coupled to the first clock signal line; the first clock signal terminal of the shift register in a (3n+3)th stage is coupled to the third clock signal line, the second clock signal terminal of the shift register in the (3n+3)th stage is coupled to the first clock signal line, and the third clock signal terminal of the shift register in the (3n+3)th stage is coupled to the second clock signal line, where n is an integer greater than or equal to 0. Periods of clock signals provided through the first clock signal line, the second clock signal line and the third clock signal line are equal to each other, and durations of the clock signals in which the clock signals are at an active level in one period are equal to each other, and time periods when the clock signals provided through the first clock signal line, the second clock signal line and the third clock signal line are respectively at the active level are staggered in sequence.

In a third aspect, an embodiment of the present disclosure further provides a display device including the above-described cascade driving circuit.

In a fourth aspect, an embodiment of the present disclosure further provides a driving method of a shift register. The shift register includes: a precharge circuit coupled to a precharge signal input terminal, a first clock signal terminal and a first pull-up node; a first node control circuit coupled to a first power supply terminal, a second power supply terminal, a third clock signal terminal, the first pull-up node and a first pull-down node; a first output circuit coupled to a first signal output terminal, the second power supply terminal, a second clock signal terminal, the first pull-up node and the first pull-down node; a second node control circuit coupled to the precharge signal input terminal, the first power supply terminal, the second power supply terminal, the first clock signal terminal, the third clock signal terminal, a second pull-up node, and a second pull-down node; and a second output circuit coupled to the first power supply terminal, the second power supply terminal, the first pull-up node and the first pull-down node. The driving method includes: in a precharge phase, writing a precharge signal provided through the precharge signal input terminal to the first pull-up node by the precharge circuit, writing a second operating voltage provided through the second power supply terminal to the first pull-up node by the first node control circuit, writing the precharge signal to the second pull-down node and writing the second operating voltage to the second pull-up node by the second node control circuit, writing a second clock signal provided through the second clock signal terminal to the first signal output terminal by the first output circuit, and writing the second operating voltage to the second signal output terminal by the second output circuit; in an output phase, continuously writing the second clock signal to the first signal output terminal by the first output circuit, and continuously writing the second operating voltage to the second signal output terminal by the second output circuit; and in a reset phase, writing a first operating voltage provided through the first power supply terminal to the first pull-down node and the second operating voltage to the first pull-up node by the first node control circuit, writing the second operating voltage to the second pull-down node and the first operating voltage to the second pull-up node by the second node control circuit, writing the second operating voltage to the first signal output terminal by the first output circuit, and writing the first operating voltage to the second signal output terminal by the second output circuit.

DETAILED DESCRIPTION

In order to make those skilled in the art better understand the technical solution of the present disclosure, a shift register, a driving method thereof, a cascade driving circuit and a display device provided through the present disclosure will be described in detail below with reference to the accompanying drawings.

It should be noted that the transistors adopted in the embodiments of the present disclosure may be thin film transistors or field effect transistors, or other devices having the same or similar characteristics, and since a source electrode and a drain electrode of each transistor adopted are symmetrical, there is no difference between the source electrode and the drain electrode. In the embodiments of the present disclosure, to distinguish the source electrode and the drain electrode of the transistor, one of the source and drain electrodes is referred to as a first electrode, the other of the source and drain electrodes is referred to as a second electrode, and a gate electrode of the transistor is referred to as a control electrode. In addition, the transistors can be divided into N-type and P-type according to the characteristics of the transistors, and the following embodiments are illustrated by taking N-type transistors as an example. When N-type transistors are adopted, the first electrode is the source electrode of the N-type transistor, the second electrode is the drain electrode of the N-type transistor, and when the gate electrode inputs a high level, the transistor is turned on, which is opposite for the P-type transistor. It should be noted that the embodiment implemented by using the P-type transistor is also within the protection scope of the present disclosure.

The embodiments of the present disclosure provide a shift register. The shift register includes a first control and output circuit and a second control and output circuit. The first control and output circuit is coupled to a first power supply terminal, a second power supply terminal, a first clock signal terminal, a second clock signal terminal, a third clock signal terminal and a first signal output terminal, and configured to write, in a precharge phase and an output phase, a second clock signal provided through the second clock signal terminal to the first signal output terminal in response to a first clock signal provided through the first clock signal terminal and a precharge signal provided through a precharge signal input terminal, and write, in a reset phase, a second operating voltage provided through the second power supply terminal to the first signal output terminal in response to a third clock signal provided through the third clock signal terminal. The second control and output circuit is coupled to the first power supply terminal, the second power supply terminal, the third clock signal terminal, the precharge signal input terminal, and a second signal output terminal, and configured to write, in the precharge phase and the output phase, a first operating voltage provided through the first power supply terminal to the second signal output terminal in response to the first clock signal and the precharge signal, and write, in the reset phase, the second operating voltage to the second signal output terminal in response to the third clock signal.

Figure 1:
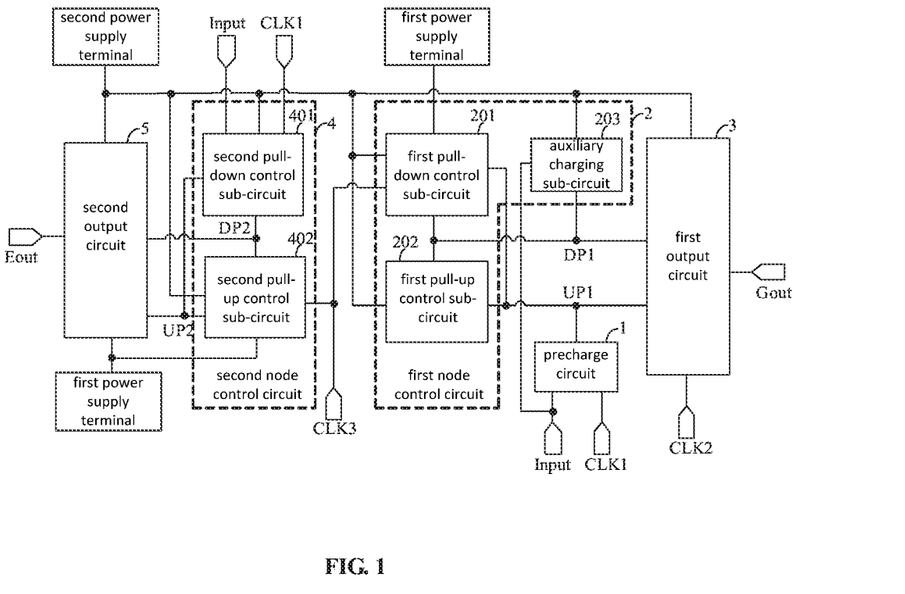
FIG. 1 is a block diagram of a shift register according to an embodiment of the present disclosure.

FIG. 1 is a block diagram of a shift register according to an embodiment of the present disclosure. As shown in FIG. 1, the shift register includes: a precharge circuit 1, a first node control circuit 2, a first output circuit 3, a second node control circuit 4, and a second output circuit 5. The precharge circuit 1, the first node control circuit 2, and the first output circuit 3 constitute the first control and output circuit, and the second node control circuit 4 and the second output circuit 5 constitute the second control and output circuit.

The precharge circuit 1 is coupled to the precharge signal input terminal Input, the first clock signal terminal CLK1, and a first pull-up node UP1, and configured to write, in a precharge phase, the precharge signal provided through the precharge signal input terminal Input to the first pull-up node UP1 in response to the first clock signal provided through the first clock signal terminal CLK1.

The first node control circuit 2 is coupled to the first power supply terminal, the second power supply terminal, the third clock signal terminal CLK3, the first pull-up node UP1, a first pull-down node DP1, and configured to write a second operating voltage provided through the second power supply terminal to the first pull-down node DP1 in response to the voltage at the first pull-up node UP1 in the precharge phase, and to write the first operating voltage provided through the first power supply terminal to the first pull-down node DP1 and write the second operating voltage to the first pull-up node UP1 in response to the third clock signal provided through the third clock signal terminal CLK3 in the reset phase.

The first output circuit 3 is coupled to the first signal output terminal Gout, the second power supply terminal, the second clock signal terminal CLK2, the first pull-up node UP1, and the first pull-down node DP1, and configured to write the second clock signal provided through the second clock signal terminal CLK2 to the first signal output terminal Gout in response to the voltage at the first pull-up node UP1 in the precharge phase and the output phase, and to write the second operating voltage to the first signal output terminal Gout in response to the voltage at the first pull-down node DP1 in the reset phase.

The second node control circuit 4 is coupled to the precharge signal input terminal Input, the first power supply terminal, the second power supply terminal, the first clock signal terminal CLK1, the third clock signal terminal CLK3, a second pull-up node UP2, and a second pull-down node DP2, and configured to write the precharge signal to the second pull-down node DP2 and write the second operating voltage to the second pull-up node UP2 in response to the first clock signal in the precharge phase, and to write the first operating voltage to the second pull-up node UP2 and write the first operating voltage to the second pull-down node DP2 in response to the third clock signal in the reset phase.

The second output circuit 5 is coupled to the first power supply terminal, the second power supply terminal, the first pull-up node UP1, and the first pull-down node DP1, and configured to write the first operating voltage to a second signal output terminal Eout in response to the voltage at the second pull-up node UP2 in the precharge phase and the output phase, and to write the second operating voltage to the second signal output terminal Eout in response to the voltage at the second pull-down node DP2 in the reset phase.

The shift register according to the embodiment of the present disclosure includes the precharge circuit 1, the first node control circuit 2, the first output circuit 2, the second node control circuit 4, and the second output circuit 5. With the cooperation of the five circuits, two different driving signals can be output simultaneously through the first signal output terminal Gout and the second signal output terminal Eout, thereby reducing the complexity of the circuit, reducing the occupied space, and facilitating the narrow bezel design of the display device.

Figure 2:
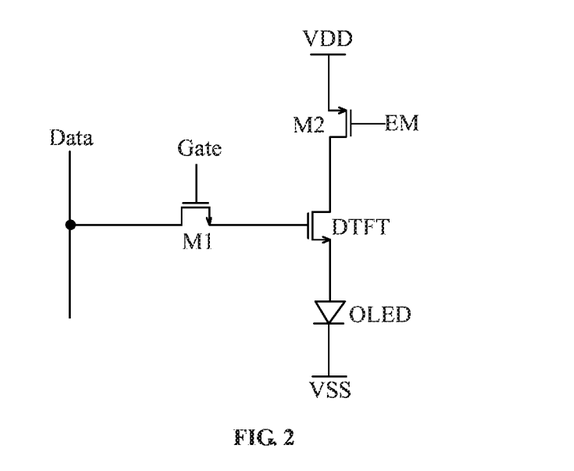
FIG. 2 is a circuit schematic diagram of a pixel circuit.
Figure 3:
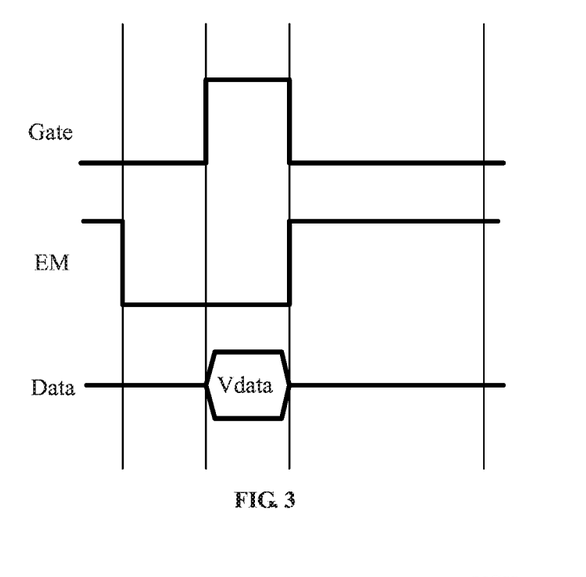
FIG. 3 is a timing diagram illustrating an operation of the pixel circuit shown in FIG. 2.

FIG. 2 is a circuit schematic diagram of a pixel circuit, and FIG. 3 is a timing diagram illustrating an operation of the pixel circuit shown in FIG. 2. As shown in FIGS. 2 and 3, the pixel circuit includes a data writing transistor M1, a light emission control transistor M2, and a driving transistor DTFT. A control electrode of the data writing transistor M1 is coupled to a gate line Gate of a corresponding row, a control electrode of the light emission control transistor M2 is coupled to a corresponding light emission control signal line EM, the gate line Gate is configured to provide a gate driving signal to the data writing transistor M1, and the light emission control signal line EM writes a light emission control signal to the light emission control transistor M2. When the gate driving signal in the gate line Gate is at an active level, the data signal Vdata in the data line Data may be written to the pixel circuit through the data writing transistor M1, and at this time, the driving transistor DTFT may output a corresponding driving current to the light emitting device OLED according to the voltage at its gate electrode under the condition that the light emission control signal in the light emission control signal line EM is at an active level to turn on the light emission control transistor M2.

As a specific application of the technical solution of the present disclosure, the driving signal output through the first signal output terminal Gout serves as a gate driving signal to be written to the gate line Gate of the corresponding row in the display panel, and the driving signal output through the second signal output terminal Eout serves as a light emitting control signal to be written to the light emitting control signal line EM of the corresponding row in the display panel. That is, the shift register can simultaneously provide the gate driving signal and the light emitting control signal to the pixel circuit. It should be noted that, the abovementioned case where the signals output through the first signal output terminal Gout and the second signal output terminal Eout respectively serve as the gate driving signal and the light emitting control signal is only one specific embodiment of the technical solution of the present disclosure, and does not limit the technical solution of the present disclosure.

Referring to FIG. 1 again, in some embodiments, the first node control circuit 2 includes a first pull-down control sub-circuit 201 and a first pull-up control sub-circuit 202.

The first pull-down control sub-circuit 201 is coupled to the first power supply terminal, the second power supply terminal, the third clock signal terminal CLK3, the first pull-up node UP1, and the first pull-down node DP1, and configured to write the second operating voltage to the first pull-down node DP1 in response to the voltage at the first pull-up node UP1 in the precharge phase, and to write the first operating voltage to the first pull-down node DP1 in response to the third clock signal in the reset phase.

The first pull-up control sub-circuit 202 is coupled to the second power supply terminal, the first pull-up node UP1, and the first pull-down node DP1, and configured to write the second operating voltage to the first pull-up node UP1 in response to the voltage at the first pull-down node DP1 in the reset phase.

In the present disclosure, the voltage at the first pull-up node UP1 may be controlled by the precharge circuit 1 and the first pull-up control sub-circuit 202, and the voltage at the first pull-down node DP1 may be controlled by the first pull-down control sub-circuit 201.

In some embodiments, the first node control circuit 2 further includes an auxiliary charging sub-circuit 203, which is coupled to the second power supply terminal, the precharge signal input terminal Input and the first pull-down node DP1, and configured to write the second operating voltage to the first pull-down node DP1 in response to the precharge signal during the precharge phase. By providing the auxiliary charging circuit 203, the charging speed for the first pull-down node DP1 in the precharge phase can be improved.

In some embodiments, the second node control circuit 4 includes a second pull-down control sub-circuit 401 and a second pull-up control sub-circuit 402.

The second pull-down control sub-circuit 401 is coupled to the precharge signal input terminal Input, the second power supply terminal, the first clock signal terminal CLK1, the second pull-up node UP2, and the second pull-down node DP2, and configured to write the precharge signal to the second pull-down node DP2 in response to the first clock signal during the precharge phase, and to write the second operating voltage to the second pull-down node DP2 in response to the voltage at the second pull-up node UP2 during the reset phase.

The second pull-up control sub-circuit 402 is coupled to the first power supply terminal, the second power supply terminal, the third clock signal terminal CLK3, the second pull-up node UP2, and the second pull-down node DP2, and is configured to write the second operating voltage to the second pull-up node UP2 in response to the voltage at the second pull-down node DP2 during the precharge phase and the output phase, and to write the first operating voltage to the second pull-up node UP2 in response to the third clock signal during the reset phase.

In the present disclosure, the voltage at the second pull-up node UP2 may be controlled by the second pull-up control sub-circuit 402, and the voltage at the second pull-down node DP2 may be controlled by the second pull-down control sub-circuit 401.

Figure 4:
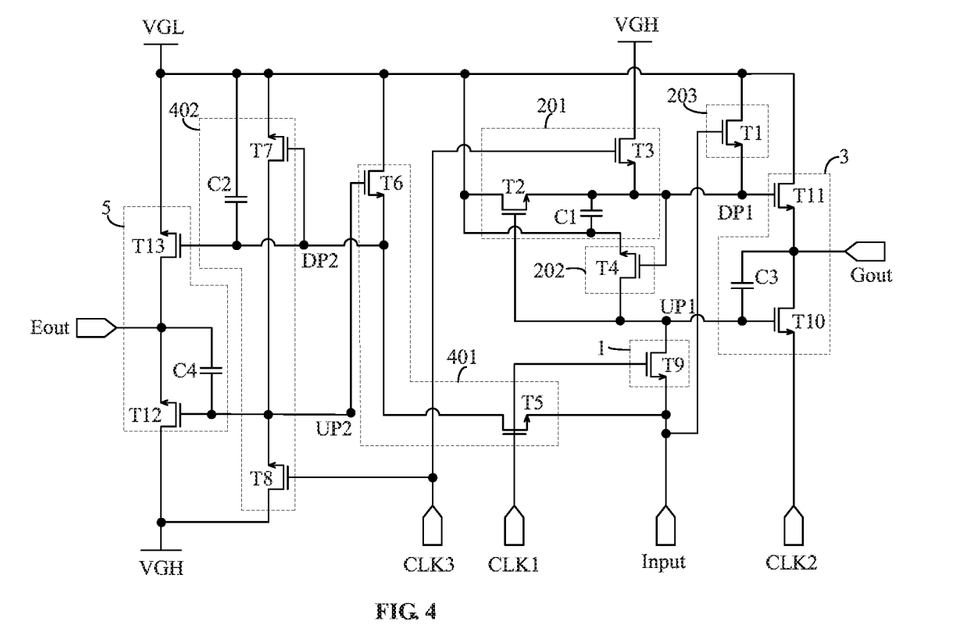
FIG. 4 is a circuit schematic diagram of a shift register according to an embodiment of the present disclosure.

FIG. 4 is a circuit schematic diagram of a shift register according to an embodiment of the present disclosure, and the shift register shown in FIG. 4 may be a specific implementation based on the shift register shown in FIG. 1.

In some embodiments, the auxiliary charging sub-circuit 203 includes a first transistor T1. A control electrode of the first transistor T1 is coupled to the precharge signal input terminal Input, a first electrode of the first transistor T1 is coupled to the second power supply terminal, and a second electrode of the first transistor T1 is coupled to the first pull-down node DP1.

In some embodiments, the first pull-down control sub-circuit 201 includes a second transistor T2 and a third transistor T3. A control electrode of the second transistor T2 is coupled to the first pull-up node UP1, a first electrode of the second transistor T2 is coupled to the second power supply terminal, and a second electrode of the second transistor T2 is coupled to the first pull-down node DP1. A control electrode of the third transistor T3 is coupled to the third clock signal terminal CLK3, a first electrode of the third transistor T3 is coupled to the first power supply terminal, and a second electrode of the third transistor T3 is coupled to the first pull-down node DP1.

Further, the first pull-down control sub-circuit 201 further includes a first capacitor C1. A first terminal of the first capacitor C1 is coupled to the second power supply terminal, and a second terminal of the first capacitor C1 is coupled to the first pull-down node DP1. By providing the first capacitor C1, the voltage at the first pull-down node DP1 can be maintained stable when the first pull-down node DP1 is in a floating state.

In some embodiments, the first pull-up control sub-circuit 202 includes a fourth transistor T4. A control electrode of the fourth transistor T4 is coupled to the first pull-down node DP1, a first electrode of the fourth transistor T4 is coupled to the second power supply terminal, and a second electrode of the fourth transistor T4 is coupled to the first pull-up node UP1.

In some embodiments, the second pull-down control sub-circuit 401 includes a fifth transistor T5 and a sixth transistor T6. A control electrode of the fifth transistor T5 is coupled to the first clock signal terminal CLK1, a first electrode of the fifth transistor T5 is coupled to the precharge signal input terminal Input, and a second electrode of the fifth transistor T5 is coupled to the second pull-down node DP2. A control electrode of the sixth transistor T6 is coupled to the second pull-up node UP2, a first electrode of the sixth transistor T6 is coupled to the second power supply terminal, and a second electrode of the sixth transistor T6 is coupled to the second pull-down node DP2.

The second pull-down control sub-circuit 401 further includes a second capacitor C2. A first terminal of the second capacitor C2 is coupled to the second power supply terminal, and a second terminal of the second capacitor C2 is coupled to the second pull-down node DP2. By providing the second capacitor C2, the voltage at the second pull-down node DP2 can be maintained stable when the second pull-down node DP2 is in a floating state.

In some embodiments, the second pull-up control sub-circuit 402 includes a seventh transistor T7 and an eighth transistor T8. A control electrode of the seventh transistor T7 is coupled to the second pull-down node DP2, a first electrode of the seventh transistor T7 is coupled to the second power supply terminal, and a second electrode of the seventh transistor T7 is coupled to the second pull-up node UP2. A control electrode of the eighth transistor T8 is coupled to the third clock signal terminal CLK3, a first electrode of the eighth transistor T8 is coupled to the first power supply terminal, and a second electrode of the eighth transistor T8 is coupled to the second pull-up node UP2.

In some embodiments, the precharge circuit 1 includes a ninth transistor T9. A control electrode of the ninth transistor T9 is coupled to the first clock signal terminal CLK1, a first electrode of the ninth transistor T9 is coupled to the precharge signal input terminal Input, and a second electrode of the ninth transistor T9 is coupled to the first pull-up node UP1.

In some embodiments, the first output circuit 3 includes a tenth transistor T10, an eleventh transistor T11, and a third capacitor C3. A control electrode of the tenth transistor T10 is coupled to the first pull-up node UP1, a first electrode of the tenth transistor T10 is coupled to the second clock signal terminal CLK2, and a second electrode of the tenth transistor T10 is coupled to the first signal output terminal Gout. A control electrode of the eleventh transistor T11 is coupled to the first pull-down node DP1, a first electrode of the eleventh transistor T11 is coupled to the second power supply terminal, and a second electrode of the eleventh transistor T11 is coupled to the first signal output terminal Gout. A first terminal of the third capacitor C3 is coupled to the first pull-up node UP1, and a second terminal of the third capacitor C3 is coupled to the first signal output terminal Gout.

In some embodiments, the second output circuit 5 includes a twelfth transistor T12, a thirteenth transistor T13, and a fourth capacitor C4. A control electrode of the twelfth transistor T12 is coupled to the second pull-up node UP2, a first electrode of the twelfth transistor T12 is coupled to the first power supply terminal, and a second electrode of the twelfth transistor T12 is coupled to the second signal output terminal Eout. A control electrode of the thirteenth transistor T13 is coupled to the second pull-down node DP2, a first electrode of the thirteenth transistor T13 is coupled to the second power supply terminal, and a second electrode of the thirteenth transistor T13 is coupled to the second signal output terminal Eout. A first terminal of the fourth capacitor C4 is coupled to the second pull-up node UP2, and a second terminal of the fourth capacitor C4 is coupled to the second signal output terminal Eout.

In some embodiments, all transistors in the shift register are N-type low temperature poly-silicon (LTPS) thin film transistors, and the thin film transistors in the shift register can be simultaneously fabricated by the same fabrication process. In addition, the N-type LTPS transistor has higher carrier mobility and lower hysteresis effect, which is beneficial to the design of a display screen with higher PPI. It should be noted that, the case where all transistors in the shift register are N-type LTPS thin film transistors is only an embodiment of the present disclosure, and does not limit the technical solution of the present disclosure.

In order to facilitate a person skilled in the art to better understand the technical solution of the present disclosure, the technical solution of the present disclosure will be illustratively described below in conjunction with the accompanying drawings. In the following description, as an example, the first operating voltage VGH provided through the first power supply terminal is a constant high-level voltage, and the second operating voltage VGL provided through the second power supply terminal is a constant low-level voltage.

Periods of the clock signals provided through the first clock signal terminal CLK1, the second clock signal terminal CLK2, and the third clock signal terminal CLK3 are equal to each other, and durations of the clock signals in which the clock signals are at an active level in one period equal to each other. Time periods when the first, second, and third clock signals are respectively at the active level are staggered in sequence. In this embodiment, in view of the N-type thin film transistor, the active level is a high level and the inactive level is a low level.

The following description is given by taking a case where the duty cycle (the ratio of the duration of the high level in one period to the period) of each of the first clock signal, the second clock signal, and the third clock signal is equal to one third as an example.

It should be understood by those skilled in the art that the case where the duty cycle of each of the three clock signals is equal to one third in the present disclosure is only an embodiment, and does not limit the technical solution of the present disclosure. In the present disclosure, it merely need to ensure that, the periods of the three clock signals are equal and the duty cycles thereof are equal, and the time periods when the three clock signals are at the active level are staggered in sequence.

Figure 5:
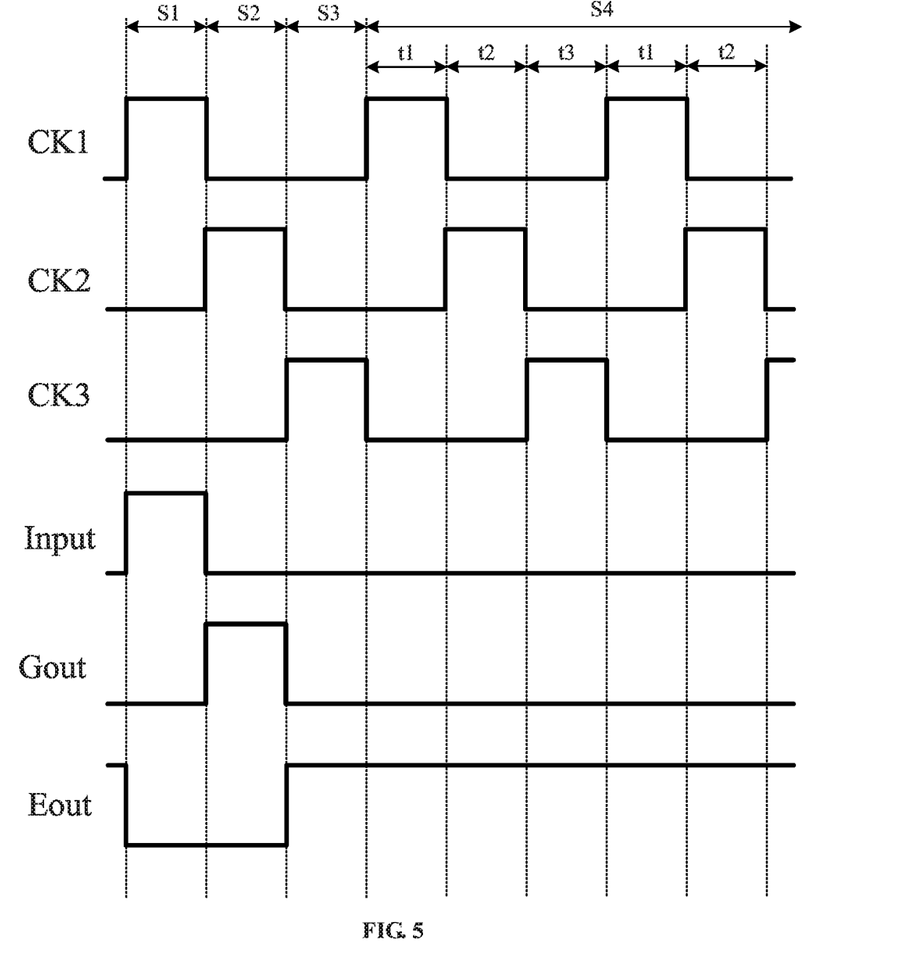
FIG. 5 is a timing diagram illustrating an operation of a shift register according to an embodiment of the present disclosure.

FIG. 5 is a timing diagram illustrating an operation of a shift register according to an embodiment of the present disclosure. As shown in FIG. 5, the operation process of the shift register may include the following three phases: a precharge phase S1, an output phase S2, and a reset phase S3.

In the precharge phase S1, the first clock signal provided through the first clock signal terminal CLK1 is at a high level, the second clock signal provided through the second clock signal terminal CLK2 is at a low level, the third clock signal provided through the third clock signal terminal CLK3 is at a low level, and the precharge signal provided through the precharge signal input terminal Input is at a high level.

Since the first clock signal is at a high level, the first transistor T1, the fifth transistor T5, and the ninth transistor T9 are turned on, the precharge signal at a high level is written to the first pull-up node UP1, and the voltage at the first pull-up node UP1 is of a high level. At this time, since the voltage at the first pull-up node UP1 is of a high level, the second transistor T2 is turned on, and the second operating voltage VGL is written to the first pull-down node DP1 via the second transistor T2; meanwhile, a low level voltage VGL is written to the first pull-down node DP1 via the first transistor T1, the voltage at the first pull-down node DP1 is of a low level, and the fourth transistor T4 is turned off.

It should be noted that, since it takes a certain time to charge the first pull-up node UP1 with the precharge signal, it takes a certain time to turn on the second transistor T2, and the efficiency of charging the first pull-down node DP1 from the second power supply terminal via the second transistor T2 is low. To this end, in the present disclosure, by providing the first transistor T1 that is turned on during the precharge phase, the first pull-down node DP1 can be charged from the second power supply terminal simultaneously through the first transistor T1 and the second transistor T2, so as to improve the charging efficiency.

Since the voltage at the first pull-up node UP1 is of a high level and the voltage at the first pull-down node DP1 is of a low level, the tenth transistor T10 is turned on, the eleventh transistor T11 is turned off, and the second clock signal is written to the first signal output terminal Gout via the tenth transistor T10, and since the second clock signal is at a low level, a low level signal is output through the first signal output terminal Gout.

Since the fifth transistor T5 is turned on, the precharge signal at a high level is written to the second pull-down node DP2, and the voltage at the second pull-down node DP2 is of a high level. At this time, since the voltage at the second pull-down node DP2 is of a high level, the seventh transistor T7 is turned on, the second operating voltage VGL is written to the second pull-up node UP2 via the seventh transistor T7, the voltage at the second pull-up node UP2 is of a low level, and the sixth transistor T6 is turned off.

Since the voltage at the second pull-up node UP2 is of a low level and the voltage at the second pull-down node DP2 is of a high level, the twelfth transistor T12 is turned off, the thirteenth transistor T13 is turned on, the second operating voltage VGL is written to the second signal output terminal Eout via the thirteenth transistor T13, and a low level signal is output through the second signal output terminal Eout.

Since the third clock signal is at a low level, both the third transistor T3 and the eighth transistor T8 are turned off.

In the output phase S2, the first clock signal provided through the first clock signal terminal CLK1 is at a low level, the second clock signal provided through the second clock signal terminal CLK2 is at a high level, the third clock signal provided through the third clock signal terminal CLK3 is at a low level, and the precharge signal provided through the precharge signal input terminal Input is at a low level.

Since the first clock signal is at a low level, both the fifth transistor T5 and the ninth transistor T9 are turned off. Since the precharge signal is at a low level, the first transistor T1 is turned off and the first pull-up node UP1 is in a floating state.

The tenth transistor T10 is maintained on, and the second clock signal is written to the first signal output terminal Gout via the tenth transistor T10. Since the second clock signal is at a high level, a high level signal is output through the first signal output terminal Gout. At this time, with the bootstrap effect of the third capacitor C3, the voltage at the first pull-up node UP1 is pulled up to a higher level.

In the output phase S2, the voltage level at the first pull-down node DP1 is maintained low, the voltage level at the second pull-up node UP2 is maintained low, and the voltage level at the second pull-down node DP2 is maintained high (the second pull-down node DP2 is floating, and the second capacitor C2 maintains the voltage at the second pull-down node DP2 to be a high level). The second transistor T2, the seventh transistor T7, and the thirteenth transistor T13 are maintained on, and the third transistor T3, the fourth transistor T4, the sixth transistor T6, the eighth transistor T8, the eleventh transistor T11, and the twelfth transistor T12 are maintained off. The second operating voltage VGL is written to the second signal output terminal Eout via the thirteenth transistor T13, that is, a low level signal is output through the second signal output terminal Eout.

In the reset phase S3, the first clock signal provided through the first clock signal terminal CLK1 is at a low level, the second clock signal provided through the second clock signal terminal CLK2 is at a low level, the third clock signal provided through the third clock signal terminal CLK3 is at a high level, and the precharge signal provided through the precharge signal input terminal Input is at a low level.

Since the third clock signal is at a high level, the third and eighth transistors T3 and T8 are turned on. The first operating voltage VGH is written to the first pull-down node DP1 via the third transistor T3, and at this time, the voltage at the first pull-down node DP1 is of a high level, the fourth transistor T4 is turned on, the second operating voltage VGL is written to the first pull-up node UP1 via the fourth transistor T4, the voltage at the first pull-up node UP1 is of a low level, and the second transistor T2 is in an off state. Meanwhile, since the precharge signal is at a low level, the first transistor T1 is in an off state.

Since the voltage at the first pull-up node UP1 is of a low level and the voltage at the first pull-down node DP1 is of a high level, the tenth transistor T10 is turned off, the eleventh transistor T11 is turned on, and the second operating voltage VGL is written to the first signal output terminal Gout via the eleventh transistor T11, that is, a low level signal is output through the first signal output terminal Gout.

Meanwhile, the first operating voltage VGH is written to the second pull-up node UP2 via the eighth transistor T8, the voltage at the second pull-up node UP2 is of a high level, the sixth transistor T6 is turned on, the second operating voltage VGL is written to the second pull-down node DP2 via the sixth transistor T6, the voltage at the second pull-down node DP2 is of a low level, and the seventh transistor T7 is turned off.

Since the voltage at the second pull-up node UP2 is of a high level and the voltage at the second pull-down node DP2 is of a low level, the twelfth transistor T12 is turned on, the thirteenth transistor T13 is turned off, the first operating voltage VGH is written to the second signal output terminal Eout via the twelfth transistor T12, and a high level signal is output through the second signal output terminal Eout.

It should be noted that, after the reset phase S3 of the current period ends, the shift register always operates in a sustaining phase S4 until the precharge phase S1 of the next period begins.

The sustaining phase S4 includes three sub-phases that are repeatedly executed: a first sub-phase t1 to a third sub-phase t3.

In the first sub-phase t1, the first clock signal provided through the first clock signal terminal CLK1 is at a high level, the second clock signal provided through the second clock signal terminal CLK2 is at a low level, the third clock signal provided through the third clock signal terminal CLK3 is at a low level, and the precharge signal provided through the precharge signal input terminal Input is at a low level.

At this time, since the first clock signal is at a high level, the fifth transistor T5 and the ninth transistor T9 are turned on; meanwhile, the precharge signal at a low level is written to the second pull-down node DP2 and the first pull-up node UP1 via the fifth transistor T5 and the ninth transistor T9, respectively, such that the voltage levels at the second pull-down node DP2 and the first pull-up node UP1 are maintained low.

In the first sub-phase t1, the voltage level at the first pull-down node DP1 is maintained high (the first pull-down node DP1 is in a floating state, the first capacitor C1 maintains the voltage at the first pull-down node DP1 to be a high level), and the voltage level at the second pull-up node UP2 is maintained high. The fourth transistor T4, the sixth transistor T6, the eleventh transistor T11, and the twelfth transistor T12 are maintained on, and the first transistor T1, the second transistor T2, the third transistor T3, the seventh transistor T7, the eighth transistor T8, the tenth transistor T10, and the thirteenth transistor T13 are maintained off.

The second operating voltage VGL is written to the first signal output terminal Gout via the eleventh transistor T11, and the first operating voltage VGH is written to the second signal output terminal Eout via the twelfth transistor T12. That is, the low level signal is continuously output through the first signal output terminal Gout, and the high level signal is continuously output through the second signal output terminal Eout.

In the second sub-phase t2, the first clock signal provided through the first clock signal terminal CLK1 is at a low level, the second clock signal provided through the second clock signal terminal CLK2 is at a high level, the third clock signal provided through the third clock signal terminal CLK3 is at a low level, and the precharge signal provided through the precharge signal input terminal Input is at a low level.

Since the first clock signal is at a low level, the fifth transistor T5 and the ninth transistor T9 are turned off. At this time, the voltage level at the first pull-up node UP1 is maintained low, the voltage level at the first pull-down node DP1 is maintained high, the voltage level at the second pull-up node UP2 is maintained high, and the voltage level at the second pull-down node DP2 is maintained low. The fourth transistor T4, the sixth transistor T6, the eleventh transistor T11, and the twelfth transistor T12 are maintained on, and the first transistor T1, the second transistor T2, the third transistor T3, the seventh transistor T7, the eighth transistor T8, the tenth transistor T10, and the thirteenth transistor T13 are maintained off.

The second operating voltage VGL is written to the first signal output terminal Gout via the eleventh transistor T11, and the first operating voltage VGH is written to the second signal output terminal Eout via the twelfth transistor T12. That is, the low level signal is continuously output through the first signal output terminal Gout, and the high level signal is continuously output through the second signal output terminal Eout.

In the third sub-phase t3, the first clock signal provided through the first clock signal terminal CLK1 is at a low level, the second clock signal provided through the second clock signal terminal CLK2 is at a low level, the third clock signal provided through the third clock signal terminal CLK3 is at a high level, and the precharge signal provided through the precharge signal input terminal Input is at a low level.

Since the third clock signal is at a high level, the third transistor T3 and the eighth transistor T8 are turned on, and the first operating voltage VGH is written to the first pull-down node DP1 and the second pull-up node UP2 via the third transistor T3 and the eighth transistor T8, respectively, to maintain the high level of the voltages at the first pull-down node DP1 and the second pull-up node UP2, preventing a problem that the eleventh transistor T11 and the twelfth transistor T12 are undesirably turned off due to voltage drift at the first pull-down node DP1 and the second pull-up node UP2.

In the third sub-phase t3, the voltage level at the first pull-up node UP1 is maintained low, the voltage level at the first pull-down node DP1 is maintained high, the voltage level at the second pull-up node UP2 is maintained high, and the voltage level at the second pull-down node DP2 is maintained low. The fourth transistor T4, the sixth transistor T6, the eleventh transistor T11, and the twelfth transistor T12 are maintained on, and the first transistor T1, the second transistor T2, the seventh transistor T7, the tenth transistor T10, and the thirteenth transistor T13 are maintained off.

The second operating voltage VGL is written to the first signal output terminal Gout via the eleventh transistor T11, and the first operating voltage VGH is written to the second signal output terminal Eout via the twelfth transistor T12. That is, the low level signal is continuously output through the first signal output terminal Gout, and the high level signal is continuously output through the second signal output terminal Eout.

In the sustaining phase S4, the first to third sub-phases t1 to t3 are repeated, so that the voltage levels at the first pull-up node UP1 and the second pull-down node DP2 are always low, the voltage levels at the first pull-down node DP1 and the second pull-up node UP2 are always high, the eleventh transistor T11 and the twelfth transistor T12 are maintained on, the low level signal is continuously output through the first signal output terminal Gout, and the high level signal is continuously output through the second signal output terminal Eout.

When the precharge signal provided through the precharge signal input terminal Input is at a high level and the first clock signal provided through the first clock signal terminal CLK1 is at a high level, it enters into the precharge phase of the next period and the above process is repeated.

Figure 6:
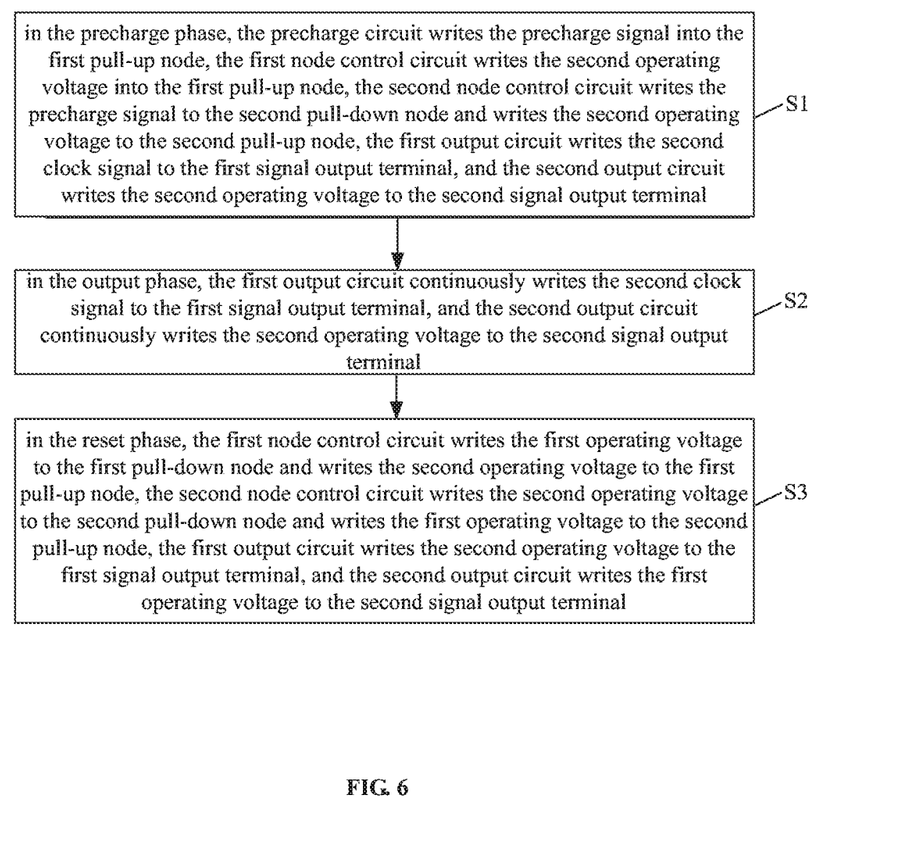
FIG. 6 is a flowchart of a driving method of a shift register according to an embodiment of the present disclosure.

FIG. 6 is a flowchart of a driving method of a shift register according to an embodiment of the present disclosure. As shown in FIG. 6, the driving method includes steps S1 to S3.

In step S1, in the precharge phase, the precharge circuit writes the precharge signal to the first pull-up node, the first node control circuit writes the second operating voltage to the first pull-up node, the second node control circuit writes the precharge signal to the second pull-down node and writes the second operating voltage to the second pull-up node, the first output circuit writes the second clock signal to the first signal output terminal, and the second output circuit writes the second operating voltage to the second signal output terminal.

In step S2, in the output phase, the first output circuit continuously writes the second clock signal to the first signal output terminal, and the second output circuit continuously writes the second operating voltage to the second signal output terminal.

In step S3, in the reset phase, the first node control circuit writes the first operating voltage to the first pull-down node and writes the second operating voltage to the first pull-up node, the second node control circuit writes the second operating voltage to the second pull-down node and writes the first operating voltage to the second pull-up node, the first output circuit writes the second operating voltage to the first signal output terminal, and the second output circuit writes the first operating voltage to the second signal output terminal.

For the detailed description of steps S1 to S3, reference may be made to the corresponding contents in the foregoing embodiments, and details are not repeated here.

Figure 7:
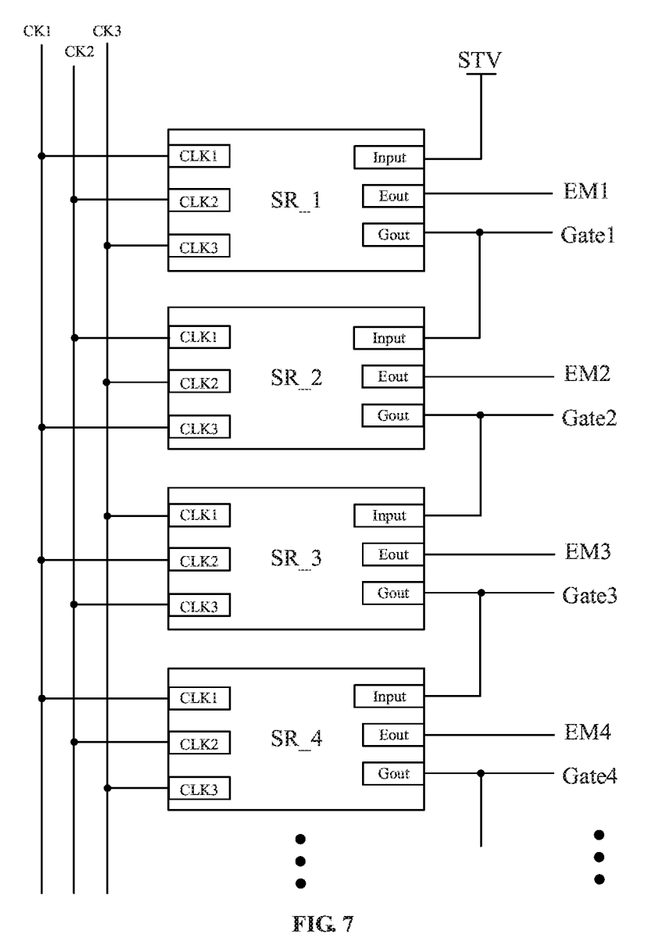
FIG. 7 is a circuit schematic diagram of a cascade driving circuit according to an embodiment of the present disclosure.

FIG. 7 is a circuit schematic diagram of a cascade driving circuit according to an embodiment of the present disclosure. As shown in FIG. 7, the cascade driving circuit according to the present disclosure may serve as a combination of a GOA circuit and a pixel driving circuit, and may be disposed in a peripheral area of a display panel. The cascade driving circuit includes a plurality of shift registers SR_1, SR_2, SR_3, and SR_4 that are cascaded, where the shift registers each is the shift register according to any of the above embodiments.

It is assumed that the cascade driving circuit includes shift registers in N stages (only 4 stages of shift registers are exemplarily shown in the drawing). In the cascade driving circuit, the precharge signal input terminal Input of the shift register SR_11 in the first stage is coupled to the frame starting signal input terminal STV; for each of the shift registers other than the shift register SR_1 in the first stage (that is, the shift registers SR_2, SR_3, SR_4), the precharge signal input terminal Input of the shift register is coupled to the first signal output terminal Gout of the shift register in a previous stage.

Among the shift registers in the N stages, the first clock signal terminal CLK1 of the shift register in a (3n+1)th stage is coupled to a first clock signal line CK1, the second clock signal terminal CLK2 of the shift register in the (3n+1)th stage is coupled to a second clock signal line CK2, and the third clock signal terminal CLK3 of the shift register in the (3n+1)th stage is coupled to a third clock signal line CK3; the first clock signal terminal CLK1 of the shift register in a (3n+2)th stage is coupled to the second clock signal line CK2, the second clock signal terminal CLK2 of the shift register in the (3n+2)th stage is coupled to the third clock signal line CK3, and the third clock signal terminal CLK3 of the shift register in the (3n+2)th stage is coupled to the first clock signal line CK1; the first clock signal terminal CLK1 of the shift register in a (3n+3)th stage is coupled to the third clock signal line CK3, the second clock signal terminal CLK2 of the shift register in the (3n+3)th stage is coupled to the first clock signal line CK1, and the third clock signal terminal CLK3 of the shift register in the (3n+3)th stage is coupled to the second clock signal line CK2, where n is an integer greater than or equal to 0 and 3n+3<N.

The periods of the clock signals provided through the first clock signal line CK1, the second clock signal line CK2 and the third clock signal line CK3 are equal to each other, and durations of the clock signals in which the clock signals are at an active level in one period are equal to each other, and time periods when the clock signals provided through the first clock signal line CK1, the second clock signal line CK2 and the third clock signal line CK3 are respectively at the active level are staggered in sequence.

As a specific implementation, the first signal output terminal Gout of each shift register is coupled to the gate line Gate1/Gate2/Gate3/Gate4 of a corresponding row in the display panel, and the second signal output terminal Eout of each shift register is coupled to the light emission control signal line EM1/EM2/EM3/EM4 of a corresponding row in the display panel.

The embodiments of the present disclosure provide a display device including the cascade driving circuit according to the above embodiment(s), and specific contents thereof may refer to corresponding contents in the above embodiment, and details are not repeated here.

The display device in the present disclosure may be any product or component with a display function, such as a display panel, a mobile phone, a tablet computer, a television, a display, a notebook computer, a digital photo frame, a navigator or the like.

It can be realized in the technical solution of the present disclosure that two different driving signals can be simultaneously output through the first signal output terminal and the second signal output terminal of the shift register, thereby reducing the complexity of the driving circuit, reducing the occupied space and facilitating the narrow bezel design of the display device.

It can be understood that the foregoing embodiments are merely exemplary embodiments used for describing the principle of the present disclosure, but the present disclosure is not limited thereto. Those of ordinary skill in the art may make various variations and improvements without departing from the spirit and essence of the present invention, and these variations and improvements shall also fall into the protection scope of the present disclosure.

What is claimed is:

1. A shift register, comprising:
   a first control and output circuit, coupled to a precharge signal input terminal, a first power supply terminal, a second power supply terminal, a first clock signal terminal, a second clock signal terminal, a third clock signal terminal and a first signal output terminal, and configured to write, in a precharge phase and an output phase, a second clock signal provided through the second clock signal terminal to the first signal output terminal in response to a first clock signal provided through the first clock signal terminal and a precharge signal provided through the precharge signal input terminal, and write, in a reset phase, a second operating voltage provided through the second power supply terminal to the first signal output terminal in response to a third clock signal provided through the third clock signal terminal; and
   a second control and output circuit, coupled to the first power supply terminal, the second power supply terminal, the third clock signal terminal, the precharge signal input terminal, and a second signal output terminal, and configured to write, in the precharge phase and the output phase, a first operating voltage provided through the first power supply terminal to the second signal output terminal in response to the first clock signal and the precharge signal, and write, in the reset phase, the second operating voltage to the second signal output terminal in response to the third clock signal.

2. The shift register of claim 1, wherein the first control and output circuit comprises:
   a precharge circuit, coupled to the precharge signal input terminal, the first clock signal terminal and the first pull-up node, and configured to write, in the precharge phase, the precharge signal to the first pull-up node in response to the first clock signal,
   a first node control circuit, coupled to the first power supply terminal, the second power supply terminal, the third clock signal terminal, the first pull-up node, and the first pull-down node, and configured to write, in the precharge phase, the second operating voltage to the first pull-down node in response to a voltage at the first pull-up node, and write, in the reset phase, the first operating voltage to the first pull-down node and the second operating voltage to the first pull-up node, in response to the third clock signal, and
   a first output circuit, coupled to the first signal output terminal, the second power supply terminal, the second clock signal terminal, the first pull-up node and the first pull-down node, and configured to write, in the precharge phase and the output phase, the second clock signal to the first signal output terminal in response to the voltage at the first pull-up node, and write, in the reset phase, the second operating voltage to the first signal output terminal in response to a voltage at the first pull-down node.

3. The shift register of claim 2, wherein the second control and output circuit comprises:
   a second node control circuit, coupled to the precharge signal input terminal, the first power supply terminal, the second power supply terminal, the first clock signal terminal, the third clock signal terminal, a second pull-up node, and a second pull-down node, and configured to write, in the precharge phase, the precharge signal to the second pull-down node and the second operating voltage to the second pull-up node, in response to the first clock signal, and write, in the reset phase, the first operating voltage to the second pull-up node and the first operating voltage to the second pull-down node, in response to the third clock signal, and
   a second output circuit, coupled to the first power supply terminal, the second power supply terminal, the first pull-up node and the first pull-down node, and configured to write, in the precharge phase and the output phase, the first operating voltage to the second signal output terminal in response to a voltage at the second pull-up node, and write, in the reset phase, the second operating voltage to the second signal output terminal in response to a voltage at the second pull-down node.

4. The shift register of claim 2, wherein the first node control circuit comprises:
   a first pull-down control sub-circuit, coupled to the first power supply terminal, the second power supply terminal, the third clock signal terminal, the first pull-up node, and the first pull-down node, and configured to write, in the precharge phase, the second operating voltage to the first pull-down node in response to the voltage at the first pull-up node, and write, in the reset phase, the first operating voltage to the first pull-down node in response to the third clock signal, and a first pull-up control sub-circuit, coupled to the second power supply terminal, the first pull-up node and the first pull-down node, and configured to write, in the reset phase, the second operating voltage to the first pull-up node in response to the voltage at the first pull-down node.

5. The shift register of claim 4, wherein the first node control circuit further comprises:

an auxiliary charging sub-circuit, coupled to the second power supply terminal, the precharge signal input terminal and the first pull-down node, and configured to write, in the precharge phase, the second operating voltage to the first pull-down node in response to the precharge signal.

6. The shift register of claim 5, wherein the auxiliary charging sub-circuit comprises a first transistor, and a control electrode of the first transistor is coupled to the precharge signal input terminal, a first electrode of the first transistor is coupled to the second power supply terminal, and a second electrode of the first transistor is coupled to the first pull-down node.

7. The shift register of claim 6, wherein the first pull-down control sub-circuit comprises a second transistor and a third transistor, a control electrode of the second transistor is coupled to the first pull-up node, a first electrode of the second transistor is coupled to the second power supply terminal, and a second electrode of the second transistor is coupled to the first pull-down node, and a control electrode of the third transistor is coupled to the third clock signal terminal, a first electrode of the third transistor is coupled to the first power supply terminal, and a second electrode of the third transistor is coupled to the first pull-down node.

8. The shift register of claim 7, wherein the first pull-down control sub-circuit further comprises a first capacitor, and a first terminal of the first capacitor is coupled to the second power supply terminal, and a second terminal of the first capacitor is coupled to the first pull-down node.

9. The shift register of claim 4, wherein the first pull-up control sub-circuit comprises a fourth transistor, and a control electrode of the fourth transistor is coupled to the first pull-down node, a first electrode of the fourth transistor is coupled to the second power supply terminal, and a second electrode of the fourth transistor is coupled to the first pull-up node.

10. The shift register of claim 3, wherein the second node control circuit comprises:

a second pull-down control sub-circuit, coupled to the precharge signal input terminal, the second power supply terminal, the first clock signal terminal, the second pull-up node, and the second pull-down node, and configured to write, in the precharge phase, the precharge signal to the second pull-down node in response to the first clock signal, and write, in the reset phase, the second operating voltage to the second pull-down node in response to the voltage at the second pull-up node, and a second pull-up control sub-circuit, coupled to the first power supply terminal, the second power supply terminal, the third clock signal terminal, the second pull-up node, and the second pull-down node, and configured to write, in the precharge phase and the output phase, the second operating voltage to the second pull-up node in response to the voltage at the second pull-down node, and write, in the reset phase, the first operating voltage to the second pull-up node in response to the third clock signal.

11. The shift register of claim 10, wherein the second pull-down control sub-circuit comprises a fifth transistor and a sixth transistor, a control electrode of the fifth transistor is coupled to the first clock signal terminal, a first electrode of the fifth transistor is coupled to the precharge signal input terminal, and a second electrode of the fifth transistor is coupled to the second pull-down node, and a control electrode of the sixth transistor is coupled to the second pull-up node, a first electrode of the sixth transistor is coupled to the second power supply terminal, and a second electrode of the sixth transistor is coupled to the second pull-down node.

12. The shift register of claim 11, wherein the second pull-down control sub-circuit further comprises a second capacitor, and a first terminal of the second capacitor is coupled to the second power supply terminal, and a second terminal of the second capacitor is coupled to the second pull-down node.

13. The shift register of claim 10, wherein the second pull-up control sub-circuit comprises a seventh transistor and an eighth transistor, a control electrode of the seventh transistor is coupled to the second pull-down node, a first electrode of the seventh transistor is coupled to the second power supply terminal, and a second electrode of the seventh transistor is coupled to the second pull-up node, and a control electrode of the eighth transistor is coupled to the third clock signal terminal, a first electrode of the eighth transistor is coupled to the first power supply terminal, and a second electrode of the eighth transistor is coupled to the second pull-up node.

14. The shift register of claim 2, wherein the precharge circuit comprises a ninth transistor, and a control electrode of the ninth transistor is coupled to the first clock signal terminal, a first electrode of the ninth transistor is coupled to the precharge signal input terminal, and a second electrode of the ninth transistor is coupled to the first pull-up node.

15. The shift register of claim 2, wherein the first output circuit comprises a tenth transistor, an eleventh transistor, and a third capacitor, a control electrode of the tenth transistor is coupled to the first pull-up node, a first electrode of the tenth transistor is coupled to the second clock signal terminal, and a second electrode of the tenth transistor is coupled to the first signal output terminal, a control electrode of the eleventh transistor is coupled to the first pull-down node, a first electrode of the eleventh transistor is coupled to the second power supply terminal, and a second electrode of the eleventh transistor is coupled to the first signal output terminal, and a first terminal of the third capacitor is coupled to the first pull-up node, and a second terminal of the third capacitor is coupled to the first signal output terminal.

16. The shift register of claim 3, wherein the second output circuit comprises a twelfth transistor, a thirteenth transistor, and a fourth capacitor, a control electrode of the twelfth transistor is coupled to the second pull-up node, a first electrode of the twelfth transistor is coupled to the first power supply terminal, and a second electrode of the twelfth transistor is coupled to the second signal output terminal, a control electrode of the thirteenth transistor is coupled to the second pull-down node, a first electrode of the thirteenth transistor is coupled to the second power supply terminal, and a second electrode of the thirteenth transistor is coupled to the second signal output terminal, and a first terminal of the fourth capacitor is coupled to the second pull-up node, and a second terminal of the fourth capacitor is coupled to the second signal output terminal.

17. The shift register of claim 1, wherein all transistors in the shift register are N-type low temperature poly-silicon thin film transistors.

18. A cascade driving circuit, comprising a plurality of shift registers that are cascaded, each of the shift registers being the shift register of claim 1,
wherein the precharge signal input terminal of the shift register in a first stage is coupled to a frame starting signal input terminal,
for each of the shift registers other than the shift register in the first stage, the precharge signal input terminal of the shift register is coupled to the first signal output terminal of the shift register in a previous stage,
the first clock signal terminal of the shift register in a (3n+1)th stage is coupled to a first clock signal line, the second clock signal terminal of the shift register in the (3n+1)th stage is coupled to a second clock signal line, and the third clock signal terminal of the shift register in the (3n+1)th stage is coupled to a third clock signal line,
the first clock signal terminal of the shift register in a (3n+2)th stage is coupled to the second clock signal line, the second clock signal terminal of the shift register in the (3n+2)th stage is coupled to the third clock signal line, and the third clock signal terminal of the shift register in the (3n+2)th stage is coupled to the first clock signal line,
the first clock signal terminal of the shift register in a (3n+3)th stage is coupled to the third clock signal line, the second clock signal terminal of the shift register in the (3n+3)th stage is coupled to the first clock signal line, and the third clock signal terminal of the shift register in the (3n+3)th stage is coupled to the second clock signal line, where n is an integer greater than or equal to 0,
periods of clock signals provided through the first clock signal line, the second clock signal line and the third clock signal line are equal to each other, and durations of the clock signals in which the clock signals are at an active level in one period are equal to each other, and
time periods when the clock signals provided through the first clock signal line, the second clock signal line and the third clock signal line are respectively at the active level are staggered in sequence.

19. A display device, comprising the cascade driving circuit of claim 18.

20. A driving method of a shift register,
the shift register comprising:
a precharge circuit coupled to a precharge signal input terminal, a first clock signal terminal and a first pull-up node;
a first node control circuit coupled to a first power supply terminal, a second power supply terminal, a third clock signal terminal, the first pull-up node and a first pull-down node;
a first output circuit coupled to a first signal output terminal, the second power supply terminal, a second clock signal terminal, the first pull-up node and the first pull-down node;
a second node control circuit coupled to the precharge signal input terminal, the first power supply terminal, the second power supply terminal, the first clock signal terminal, the third clock signal terminal, a second pull-up node, and a second pull-down node; and
a second output circuit coupled to the first power supply terminal, the second power supply terminal, the first pull-up node and the first pull-down node,
the driving method comprising:
in a precharge phase, writing a precharge signal provided through the precharge signal input terminal to the first pull-up node by the precharge circuit, writing a second operating voltage provided through the second power supply terminal to the first pull-up node by the first node control circuit, writing the precharge signal to the second pull-down node and writing the second operating voltage to the second pull-up node by the second node control circuit, writing a second clock signal provided through the second clock signal terminal to the first signal output terminal by the first output circuit, and writing the second operating voltage to the second signal output terminal by the second output circuit;
in an output phase, continuously writing the second clock signal to the first signal output terminal by the first output circuit, and continuously writing the second operating voltage to the second signal output terminal by the second output circuit; and
in a reset phase, writing a first operating voltage provided through the first power supply terminal to the first pull-down node and the second operating voltage to the first pull-up node by the first node control circuit, writing the second operating voltage to the second pull-down node and the first operating voltage to the second pull-up node by the second node control circuit, writing the second operating voltage to the first signal output terminal by the first output circuit, and writing the first operating voltage to the second signal output terminal by the second output circuit.

* * * * *